United States Patent [19]

Pryor

[11] Patent Number: 5,091,208

[45] Date of Patent: Feb. 25, 1992

[54] SUSCEPTOR FOR USE IN CHEMICAL VAPOR DEPOSITION APPARATUS AND ITS METHOD OF USE

[75] Inventor: Roger W. Pryor, Bloomfield Hills, Mich.

[73] Assignee: Wayne State University, Detroit, Mich.

[21] Appl. No.: 488,585

[22] Filed: Mar. 5, 1990

[51] Int. Cl.$^5$ ............................................. C23C 16/00
[52] U.S. Cl. ..................................... 427/38; 427/45.1; 427/46; 118/723; 118/725; 118/500
[58] Field of Search ................ 118/725, 723, 500; 427/38, 45.1, 46

[56] References Cited

U.S. PATENT DOCUMENTS

| | | | |
|---|---|---|---|
| 4,499,354 | 2/1985 | Hill et al. | 219/10.49 |
| 4,767,517 | 8/1988 | Hiraki et al. | 204/192.25 |
| 4,767,608 | 8/1988 | Matsumoto et al. | 423/446 |

OTHER PUBLICATIONS

"Emerging Technology of Diamond Thin Films", Peter K. Bachman and Russell Messier, Chemical & Engineering News, May 15, 1989, pp. 24–39.

Primary Examiner—Richard Bueker
Attorney, Agent, or Firm—Dykema Gossett

[57] ABSTRACT

A composite susceptor for forming uniform deposits by chemical vapor deposition. The composite susceptor has an electrically conducted layer of material disposed on a block of material which is adapted to be heated by an induction heating coil. The conductive layer is electrically biased to control the geometry of the gas plasma. By electrically controlling the geometry of the gas plasma, more uniform deposition of a material on a substance is achieved. A composite susceptor having a segmented conductive layer for producing a graded electrical profile and a conductive ring surrounding a gas plasma are also described. In one aspect, a phase-shifting layer of material is disposed on the conductive layer.

28 Claims, 3 Drawing Sheets

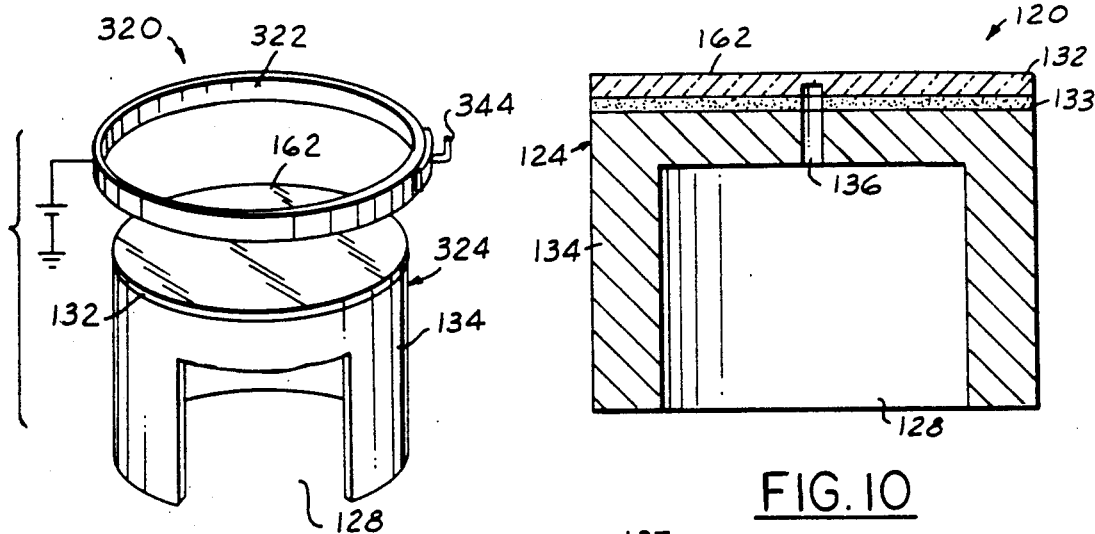
FIG. 9
FIG. 10
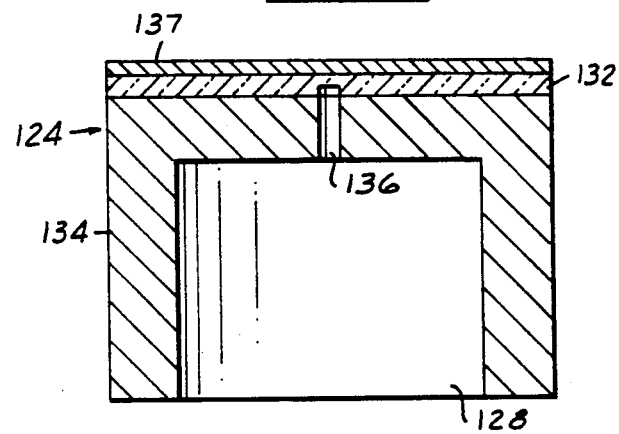
FIG. 11
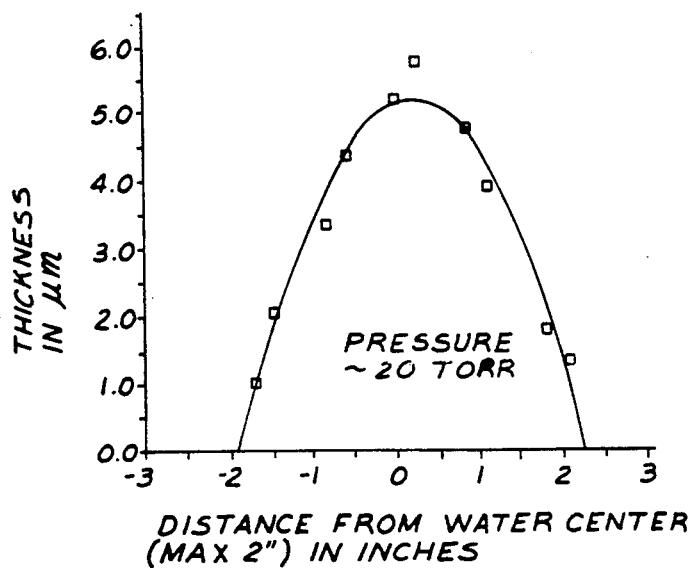
FIG. 12

SUSCEPTOR FOR USE IN CHEMICAL VAPOR DEPOSITION APPARATUS AND ITS METHOD OF USE

TECHNICAL FIELD

The present invention relates generally to chemical vapor deposition technology and, more specifically, provides a composite susceptor for use in a chemical vapor deposition apparatus.

BACKGROUND OF THE INVENTION

A number of techniques have been developed by which a material may be deposited on a substrate. One of these techniques is referred to generally as chemical vapor deposition. In chemical vapor deposition, a gaseous species in a chamber is caused to precipitate or deposit on a heated substrate or target in the chamber under precisely controlled conditions. In one type of chemical vapor deposition process, the gaseous species which forms a deposit on the substrate is a gas plasma. As those skilled in the art will appreciate, a gas plasma is made up of highly reactive species which include free electrons, ions, and radicals. Thus, a gas plasma or plasma is in essence a mixture of electrically neutral and charged particles.

One of the major applications of chemical vapor deposition processes is the fabrication of semiconductor devices for the electronics industry. Other applications include the fabrication of gas sensors, optical devices, accelerometers and thin functional and decorative coatings, all of which may also be manufactured using various thin-film techniques.

In addition to the many traditional materials processed by chemical vapor deposition, more recently it has been found that synthetic diamond can be formed in this manner. The formation of synthetic diamond is of considerable significance due to its desirable thermal and electrical properties, the latter being controllable through the introduction of dopant impurities. This interest in synthetic diamond has resulted in the development of several advances in chemical vapor deposition technology, advances which are also useful in the fabrication of non-diamond films and articles.

With respect to the fabrication of synthetic diamond by chemical vapor deposition, it has been found that gas plasma deposition, and particularly microwave gas plasma deposition, provides the greatest control over critical parameters of the process. In this regard, a gas feedstock comprising hydrogen and a carbon-containing gas such as methane or acetylene are introduced into a vacuum chamber in which the deposition of synthetic diamond on a substrate is to be carried out. The deposition apparatus includes a microwave generator which emits electromagnetic radiation at a preselected energy level into the chamber. Microwaves excite the gaseous feedstock to produce a gas plasma. The feedstock gas dissociates to form hydrogen ions, free electrons and $CH_3$ radicals, the latter serving as one of the precursors of the synthetic diamond deposit.

The substrate upon which a synthetic diamond deposit is to be formed is positioned within the vacuum chamber. In order for synthetic diamond to deposit on the substrate, the substrate must be heated to a predetermined temperature. Heat is supplied to the substrate, primarily by thermal conduction from a susceptor in the chamber which supports the substrate. The susceptor comprises a body of material which can be heated rapidly to extremely high temperatures by induction heating. Thus, the material from which the susceptor is formed must respond efficiently to inductive heating and exhibit thermal stability at high operating temperatures.

In the past, many susceptors for use in chemical vapor deposition processes have been formed of graphite. For example, one such prior art susceptor is in the form of a hollow cylinder having one open end. An induction coil is positioned in the susceptor cavity and serves to raise the susceptor to the necessary operating temperature by induction heating. The substrate, for example a silicon wafer, is placed on the closed end of the cylinder and is thereby heated primarily through conduction from the susceptor to the substrate.

The configuration of the deposition apparatus, including the placement of the substrate, is such that a gas plasma forms just above the principal surface of the substrate. Once the proper conditions are achieved for synthetic diamond deposition, diamond begins to deposit on the surface of the wafer. However, as the present inventor and others have recognized, it is difficult to achieve the uniform deposition of a material, particularly synthetic diamond, on a substrate using conventional susceptors. As will be appreciated by those skilled in the art, many properties of films are functions of film thickness. Particularly in the fabrication of microelectronic devices, it is essential that thin films of relatively uniform thicknesses be formed in a reliable and reproducible manner. Excessive variation in film thickness produces aberrant electrical characteristics which cannot be tolerated in microelectronic devices and unwanted distortion in optical devices. These variations in deposited films are a significant problem for the industry.

The present invention provides a unique solution to the problem of materials deposition uniformity which allows materials such as synthetic diamond to be deposited with far greater uniformity of thickness than was previously possible. This is achieved in the present invention by the use of a novel susceptor that promotes the formation of uniform films.

SUMMARY OF THE INVENTION

In its broadest aspect, the present invention provides a composite susceptor which includes a body having at least two distinct regions which are distinguished from one another by a difference in electrical resistance. That is, the body of the novel susceptor of the present invention has a first region or portion having a first electrical resistance and a second region or portion having a second electrical resistance. The electrical resistance of one of the regions is less than the electrical resistance of the other region at a preselected temperature. This inequality of electrical resistance is in one aspect created in the present invention through the use of dissimilar materials to form the first and second regions of the susceptor body. One of the materials has an electrical specific resistance which is lower than the specific resistance of the other material. In one embodiment, the susceptor body is configured such that in a chemical vapor deposition apparatus that region of the susceptor body having the lowest electrical resistance is closest to the substrate on which the deposit is to be formed. In another aspect, a layer of dielectric is disposed on the low-resistance layer which shifts the phase of the microwave signal to provide further control of deposit uniformity. In one aspect, under an electrical bias the low-resistance layer provides a plane of equipotential which regulates the uniformity of material deposited from a gaseous species on a superincumbent substrate.

In another aspect, the region of lower resistance, i.e., the high conductance layer comprises two or more nested rings which are electrically isolated from one another by an intervening region of insulator. In this embodiment, each ring of high conductance material can be separately biased at a predetermined voltage to produce a graded potential profile.

In still another aspect, the composite susceptor of the present invention is an assembly which includes a ring of electrically conductive material positioned above the susceptor body. By biasing the conductive ring, uniformity characteristics of the deposit are controlled electrically.

In still another aspect, the present invention provides a chemical vapor deposition apparatus which includes the composite susceptor and/or the novel susceptor assembly of the present invention. The chemical vapor apparatus of the present invention promotes the growth of uniform deposits on substrates and is particularly useful in the fabrication of synthetic diamond films.

In still another aspect, the present invention provides a method of forming a deposit of material on a substrate by chemical vapor deposition which includes the steps of flowing a feedstock gas into the chamber of a chemical vapor deposition apparatus, placing a substrate on a composite susceptor as provided by the present invention, forming a gas plasma in the chamber, heating the composite susceptor to a predetermined temperature such that a layer of material will form from the plasma as a deposit on the substrate, and applying an electrical bias to the low-resistance layer of the composite susceptor and/or to the conductive ring structure of the susceptor assembly of the present invention to control the deposition characteristics of the plasma onto the substrate.

BRIEF DESCRIPTION OF THE DRAWINGS

FIG. 9 is a perspective view of the susceptor shown in FIG. 7.

FIG. 10 is a side elevational view of a composite susceptor in cross-section in accordance with the present invention wherein a layer of dielectric is disposed beneath the conductive layer.

FIG. 11 is side elevational view of a composite susceptor in accordance with the present invention in cross-section wherein a layer of phase-shifting material is disposed on the conductive layer.

FIG. 12 is a graph illustrating the uniformity of a diamond deposit made in accordance with the present invention.

DESCRIPTION OF THE PREFERRED EMBODIMENTS

Figure 1:
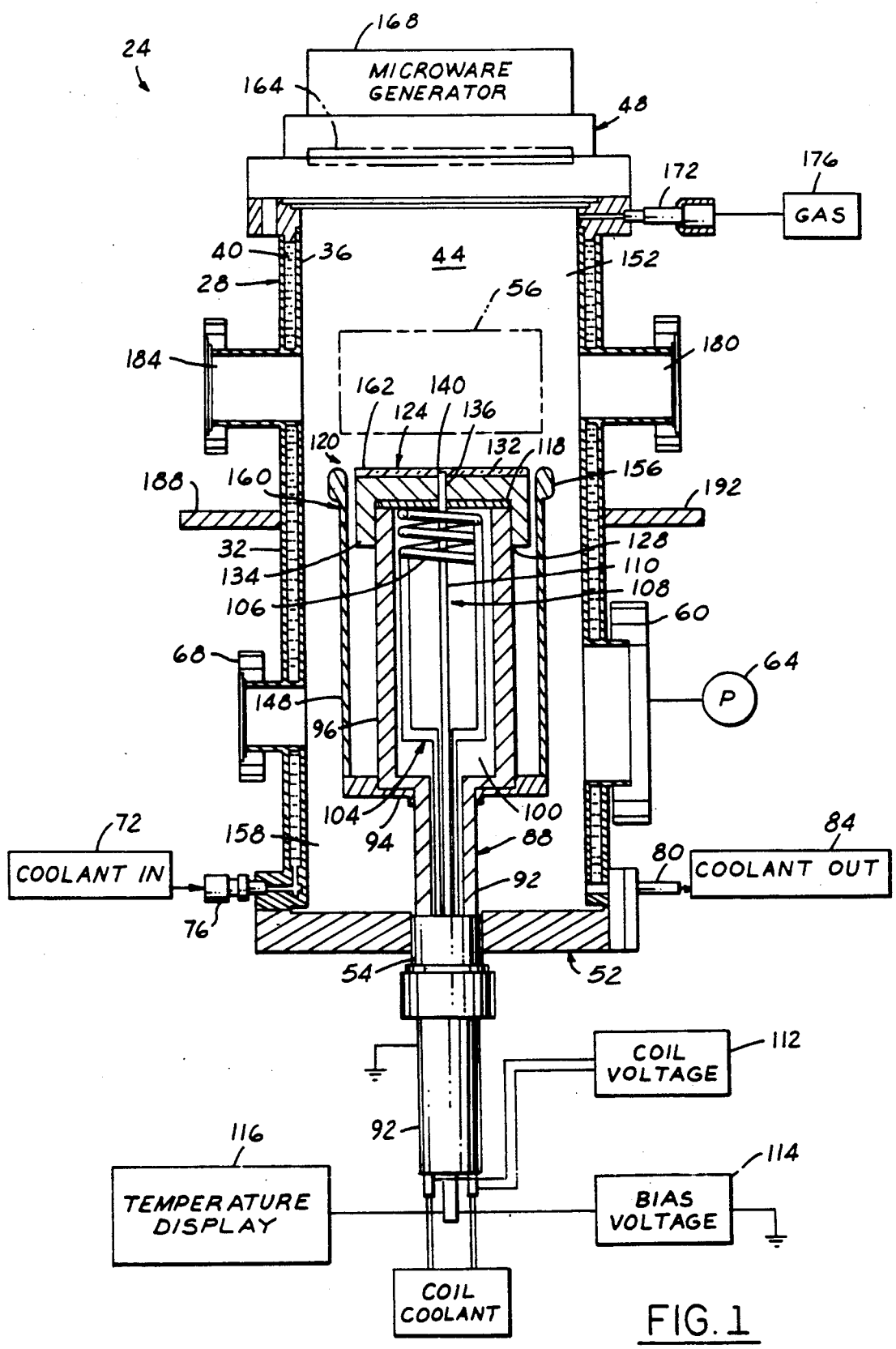
FIG. 1 is a side elevational view of a chemical vapor deposition apparatus in accordance with the present invention; portions of the apparatus are shown in cross-section and other features as functional blocks.

Referring now to FIG. 1 of the drawings, chemical vapor deposition apparatus 24 is shown having housing 28 principally comprised of a pair of concentric tubes, outer tube 32 and inner tube 36. Tubes 32 and 36 define coolant jacket or space 40 through which a coolant is circulated during operation. Inner tube 36 further defines chamber 44 in which chemical vapor deposition is carried out. Chamber 44 is further defined by cap assembly 48 and by base plate assembly 52.

Access door or port 56 shown in phantom is provided by which chamber 44 of chemical vapor deposition apparatus 24 is accessed for the placement and removal of the substrate upon which a deposit of material is to be formed. In order to control pressure within chamber 44 pump port 60 is provided which is in communication with pump 64 shown in block diagram form. An auxiliary port 68 is preferably provided to allow probes or the like (not shown) to be inserted in chamber 44 to monitor reaction conditions.

In order to circulate a coolant such as water through coolant jacket 40, which is important to maintain proper temperature control during the deposition process, coolant from coolant reservoir 72 is flowed into coolant jacket 40 via coolant inlet port 76. In operation, coolant circulates through coolant jacket 40 which is in heat exchange relationship with chamber 44. Coolant then flows through coolant outlet port 80 to coolant reservoir 84 (coolant reservoirs 72 and 84 again being shown in block diagram form).

Positioned within chamber 44, retractable substrate support assembly 88 is shown which includes support shaft 92 that extends out from chamber 44 through a bore in base plate assembly 52 with sleeve 54 forming an hermetic seal. Plate 94 is provided integral with shaft 92. Hollow ceramic susceptor support 96 which defines cavity 100 in which induction coil assembly 104 having coil 106 is positioned is supported by plate 94. In addition, in a preferred embodiment, temperature probe or thermocouple 108 extends through hollow ceramic susceptor support 96 in a manner which will be further described. Temperature probe 108 includes a metallic cover or sheath 110, the function of which will also be more fully described herein. A suitable, biasable thermocouple may be obtained, for example, from Omega Corporation. Induction coil assembly 104 is formed, for example, of hollow copper tubing, and along with temperature probe or thermocouple 108, extends through shaft 92. Bias voltage source 112 for biasing induction coil assembly 104 and bias voltage source 114 for applying an electrical bias to metallic cover 110 are also provided. Similarly, temperature display 116 which displays the readout from temperature probe 108 during operation is provided.

Figure 2:
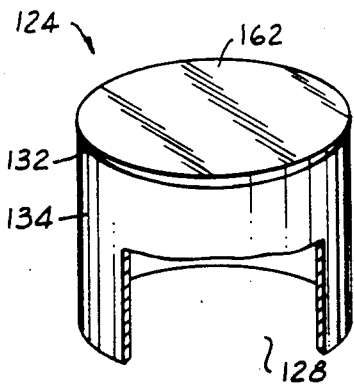
FIG. 2 is a perspective view of the composite susceptor of the present invention with a portion of the body wall broken away to expose the susceptor cavity.
Figure 3:
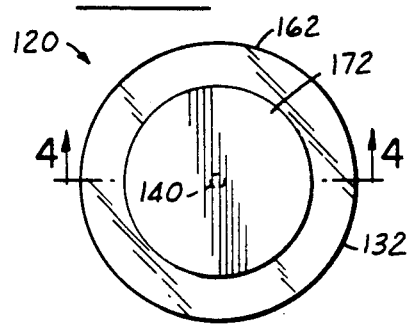
FIG. 3 is a plan view of the composite susceptor of the present invention in one embodiment.

At one end of hollow ceramic susceptor support 96, cap 118 is seen having a central bore through which temperature probe 108 extends. Mounted on the capped end of hollow ceramic susceptor support 96 composite susceptor 120 of the present invention is shown which includes body 124 defining cavity 128 which is best shown in FIG. 2 of the drawings. It will be appreciated that in this embodiment of the invention, and as illustrated in FIGS. 2 and 3 of the drawings, composite susceptor 120 in one embodiment is a short hollow cylinder. Thus, cavity 128 is cylindrical and is adapted to closely receive hollow ceramic susceptor support 96 which is also cylindrical. It is important to note that susceptor 120 is essentially electrically isolated other than through its contact with metallic cover 110 of temperature probe 108 a feature which will be more fully explained.

Referring to FIGS. 1 and 2 of the drawings, body 124 of composite susceptor 120 includes electrically conductive layer 132, which is in ohmic contact with metal sheath 110. Body 124 of composite susceptor 120 further includes a layer or region 134 which is less electrically conductive than conductive layer 132 and which generally is of a greater volume than electrically conductive layer 132. Thus, it will be understood that body 124 of composite susceptor 120 includes a low electrical resistance region or portion, i.e., layer 132, disposed on a region or portion, i.e., layer 134, which has an electrical resistance higher than that of layer 132. The preferred materials for use in forming layers 132 and 134, and the significance in the electrical characteristics of body 124 will be further described hereinafter. In this particular embodiment, layer 134 includes temperature probe receiving bore 136. A layer or sleeve of dielectric (not shown) may isolate metallic cover 110 from direct contact with layer 134. Similarly, electrically conductive layer 132 includes a temperature probe receiving depression 140 to form the electrical contact with metallic cover 110.

Retractable substrate support assembly 88 further includes stainless steel sleeve 148 mounted on plate 96 which is also preferably stainless steel. Chamber 44 includes an upper region 152 and a lower region 158. In order to prevent microwave radiation from substantially penetrating the lower region 158 of chamber 44, dark space shield 160 is provided, the components of which are sleeve 148 and expanded rim 156. It will be appreciated that in operation microwaves move through microwave window 164 (shown in phantom) into chamber 44 from microwave generator 168 which is again shown in block diagram form. Dark shield 160 prevents a gas plasma from forming in lower region 158 in the known manner.

A gas feedstock is introduced through gas port 172 from a gas source 176. Observation ports 180 and 184 are shown extending through tubes 32 and 36. Support brackets 188 and 192 are also provided in order to mount chemical vapor deposition apparatus 24 on a support assembly (not shown). It is to be emphasized that the general structure of chemical vapor deposition apparatus 24, such as the construction of housing 28 and the like, is conventional. The novelty of apparatus 24 in the present invention is in the composite susceptor 120 and in those attributes of apparatus 24 which interact with composite susceptor 12 in both structure and/or function. Thus, a detailed explanation of the method of constructing the general features of apparatus 24 will be appreciated by those of average skill in the art from the explanation of the structure and function of apparatus 24 as set forth herein.

Accordingly, and in order to gain a better understanding of the structure and operation of the present invention, a general explanation of the operating principles of chemical vapor deposition apparatus 24 will now be set forth. A feedstock gas is introduced from gas source 176 via gas port 172 into chamber 44. Where the material to be formed is synthetic diamond, the feedstock gas will comprise hydrogen and a carbon-containing gas such as methane. The present invention is suitable with any gas which contains or may be activated to contain electrically charged species. A gas or vapor plasma is most preferred. Pressure in chamber 44 is maintained at a predetermined level, for example 50 torr. Microwave generator 168 generates microwaves of a predetermined frequency which move through microwave window 164 into chamber 44. Penetration of the microwaves into lower portion 158 of chamber 44 is substantially prevented by dark space shield 160. The microwave energy dissociates the gas feedstock in chamber 44 to produce a gas plasma in chamber 44. A substrate such as a silicon wafer (not shown in FIG. 1) is positioned on the principal or top surface 162 of composite susceptor 120. Composite susceptor 120 is heated to a predetermined temperature by induction coil 104. It will be appreciated that induction coil 104 produces eddy currents in susceptor body 124, particularly in region 134, the composition of which is optimized for induction heating. It may be possible to heat body 124 by another method such as by a laser, or an optical lamp or the like. Throughout the process, due to the high temperatures generated, coolant is circulated through coolant jacket 40. Under these conditions, a concentrated plasma 170, a cross-section of which is generally elliptical with the major axis (X) parallel to principal surface 162, forms above the surface of the substrate (172 in FIG. 2) which is disposed on composite susceptor 120 (172). In the present invention, as will be more fully described, the shape of plasma 170 is altered to provide a more uniform material deposit on substrate 172.

Figure 4:
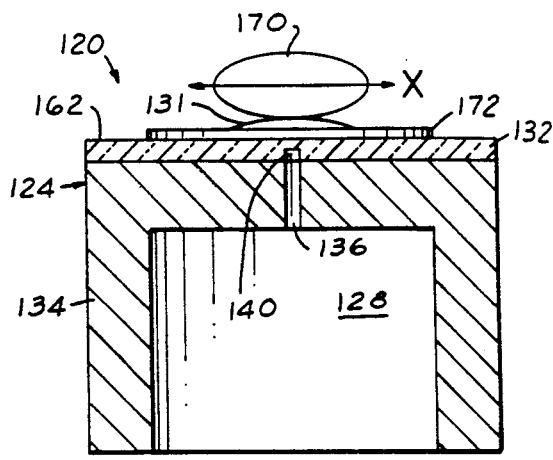
FIG. 4 is a side elevational cross-section along lines 4—4 of the susceptor of the present invention in one embodiment, with a substrate and plasma cloud also being shown.

The structure and method of making composite susceptor 120 will now be more fully described with reference to FIGS. 2, 3 and 4 of the drawings. As stated, body 124 includes layer 132 disposed on layer or region 134. In one embodiment, body 124 is a one-piece or integral structure, i.e., layer 132 is chemically or physically bonded to layer 134 such that the two layers are in intimate contact. Alternatively, layer 132 may comprise a separate plate or disc which merely rests on layer or region 134. Generally, in order to assure that layer 132 forms an equipotential plane, the bottom surface of layer 132 should be coextensive with and fully contacting the top surface of region 134 as shown in FIGS. 2, 3 and 4.

The material from which region or layer 134 is composed should exhibit several preferred characteristics. The material should be thermally stable up to approximately 1500° C. and should not undergo any significant out-gassing at these temperatures. In addition, layer 134 should perform well as a local heat source by eddy current induction via induction coil 106. The preferred material will typically have a specific resistance (volume) of from about 50 microohm-cm to about 50,000 microohm-cm and preferably from about 1,000 microohm-cm to about 30,000 microohm-cm. Examples of preferred materials for use in forming layer 134 which satisfy these requirements are polycrystalline graphite and doped cubic boron nitride. Therefore, in the broadest sense, layer 134 is formed of a material which can be heated inductively to a temperature from about 100° C. to about 1500° C. and which is thermally stable at these temperatures.

The materials suitable for forming layer 132 are those which display electrical conductivity on the level of a metallic conductor. As with layer 134, the materials used in forming layer 132 must be thermally stable and should not out-gas significantly at temperatures which may reach 1500° C. The preferred materials for use in forming layer 132 have a specific resistance (volume) of from about 2 microohm-cm to about 200 microohm-cm, and more preferably from about 2 microohm-cm to about 7 microohm-cm. The preferred materials from which layer 132 is fabricated are refractory metals. Particularly preferred are molybdenum, tungsten, tantalum, and niobium. Most preferred is molybdenum. In the broadest sense, layer 132 is formed of a material which has sufficient conductance to provide an equipotential plane as provided by the present invention.

Where layer 132 and layer 134 are formed as a unitary body 124, layer 134 may be preformed with layer 132 applied by conventional casting or coating techniques. As a unitary body, it will be appreciated that the materials used for layer 132 and layer 134 must have similar coefficients of thermal expansion to prevent the formation of stress cracks during high-temperature operation. This is not a significant concern where layer 132 is a separate plate lying on layer 134. In this alternate embodiment, i.e. where layer 132 is a separate plate, mechanical means such clamps may be suitable to attach layer 132 to layer 134.

The dimensions of composite susceptor 120 are not critical except as necessary to conform to corresponding structural limitations of chemical vapor deposition apparatus 24 and to carry out the operational characteristics of the present invention. Cavity 128 may be formed by a number of machining operations. Bore 136 and depression 140 may be formed simultaneously by a suitable drilling procedure. By way of example, body 124 may have a diameter of from about 1" to about 8" and a height of about 1" to about 5", with cavity 128 having a diameter of from about ½" to about 6" and a depth of from about ½" to about 4". Bore 136 may have a diameter of about ⅛" to about ½". Layer 132 may have a thickness of about 1/16" to about ½" and most preferably a thickness of about 1/16" to about 3/16". Depression 140 may extend from about 1/32" to about 3/32" into layer 132.

Prior to describing alternative embodiments of composite susceptor 120, the operation of the present invention will now be described with reference to FIGS. 1 and 4 of the drawings. Accordingly, a plasma cloud 170 is formed in the previously described manner; however, the shape of plasma cloud 170 above the substrate is controlled with the composite susceptor of the present invention. More bias potential of from about −500 volts to about +1000 volts relative to common ground to layer 132 via metallic cover 110 of temperature probe 108. This is accomplished by bias source 114. Since metallic cover 110 is in electrical contact with layer 132, that is, the tip of temperature probe 108 is in contact with layer 132 at depression 140, the potential of layer 132 is raised to that of metallic cover 110. It is important to understand that metallic cover 110 is preferably electrically isolated from all other structures, other than layer 132. As stated, layer 132 has a lower electrical resistance than that of layer 134. Layer 132 is at equipotential across its principal surface 162. Thus, layer 132 forms an equipotential plane beneath plasma cloud 170.

Due to the fact that plasma cloud 170 contains charged species, the shape of plasma cloud 170 can be controlled by adjusting the bias potential of layer 132. In other words, the interaction between the equipotential electric field created by biasing layer 132 (either a positive bias or a negative bias) and the charged species in plasma cloud 170 brings about a change in the shape of plasma cloud 170. It will be understood that chamber 44, at least with respect to plasma cloud 170, is effectively terminated at and by this equipotential plane. The inventor of the present invention has found that this control of plasma shape provides a means by which variations in the thickness of a deposit can be changed.

More specifically, by applying a negative electrical bias (all voltages relative to the common ground unless otherwise indicated) to layer 132 of from about 0 to about −500 volts, plasma cloud 170 spreads out or expands along the major axis X of the ellipse. Operating with layer 132 at ground potential is particularly preferred. The change in the shape of the plasma has been found to produce a remarkable increase in the uniformity of deposit 171 seen on substrate 172 in FIG. 3 of the drawings. Therefore, by electrically manipulating the geometry of plasma cloud 170, the deposition rate becomes more uniform in the area of deposit 171.

Alternatively, by applying a positive electrical bias of from about 0 to about 1000 volts (relative to ground) to layer 132, plasma cloud 170 is repelled from layer 132 and moves higher up in chamber 44. This phenomenon also brings about a change in deposition rate and characteristics of deposit 171.

Figure 6:
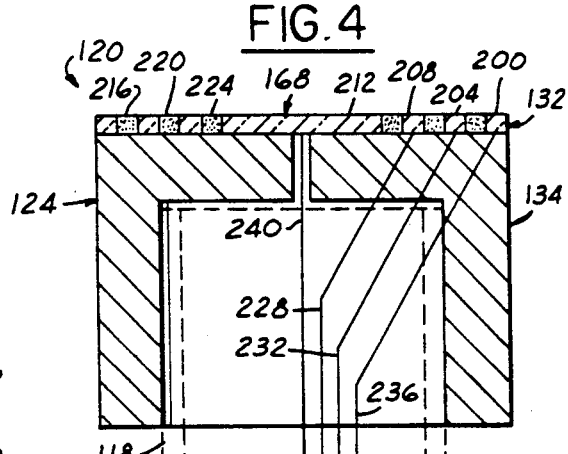
FIG. 6 is a side elevational cross-section along lines 6—6 of the composite susceptor shown in FIG. 5.
Figure 5:
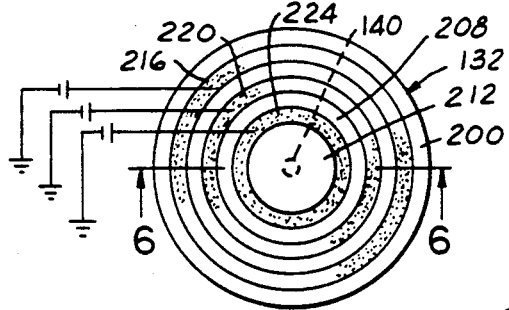
FIG. 5 illustrates a composite susceptor in accordance with the present invention having a segmented conductive layer.

In another embodiment of the present invention, and referring now to FIGS. 5 and 6 of the drawings, layer 132 is segmented as rings of conductive material 200, 204 and 208 in a nested or concentric arrangement around a center disc of conductive material 212. Separating the rings from one another, and ring 208 from disc 212, are intervening rings of dielectric shown here as regions 216, 220 and 224. Thus, the electrically conductive regions of layer 132 are electrically isolated from one another by virtue of the dielectric regions. Each conductive region is electrically biased through a separate lead 228, 232, 236 and 240. Lead 240 is shown passing through bore 128. Separate microbores are formed through region 134 for each of the other leads 228, 232 and 236. In this manner, a separate electrical potential can be established in each conductive region, allowing the potential of the plane of principal surface 168 to be graded radially. For example, in order to raise the center of plasma cloud 170 and spread the plasma cloud along the major axis X, a positive voltage of from about 0 to about 1000 volts relative to common ground is applied to disc 212 which pushes that portion of plasma 170 closest to substrate 172 upward slightly. At the same time, a negative voltage of from about 0 to about −500 volts and preferably from about −10 to about −350 volts is applied to conductive ring 200 which pulls down the edges of plasma cloud 170 toward substrate 172. An intermediate negative voltage of from about 0 to about −250 and preferably from about −5 to about −200 volts is applied to ring 204, and ring 208 is biased from about +200 to about −100 volts. Thus, it will be appreciated that the plane of principal surface 168 is graded with a positive voltage at the center and an increasing negative voltage radially toward the perimeter, i.e., toward ring 200. This tends to flatten the lower surface of plasma 170 so that it is substantially equidistant and parallel to principal surface 168 and therefore substantially equidistant from substrate 172. This brings about a uniform rate of deposition which in turn produces a deposit of uniform thickness. The separate rings of material can be made using conventional forming techniques.

This concept of the application of separate potentials to electrically isolated regions is also illustrated well in FIG. 5 which is a plan view of the composite susceptor 120 shown in FIG. 6. This graded potential profile provides considerable control of the plasma geometry.

Figure 7:
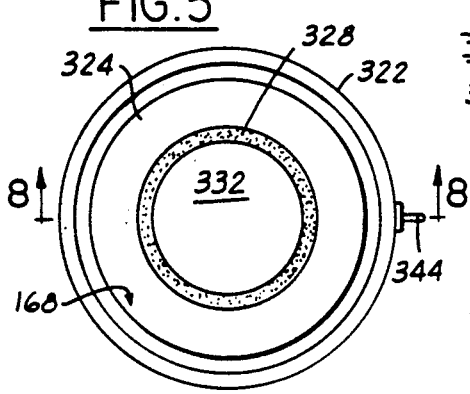
FIG. 7 is a plan view of a composite susceptor assembly having a conductive ring positioned above the susceptor body.
Figure 8:
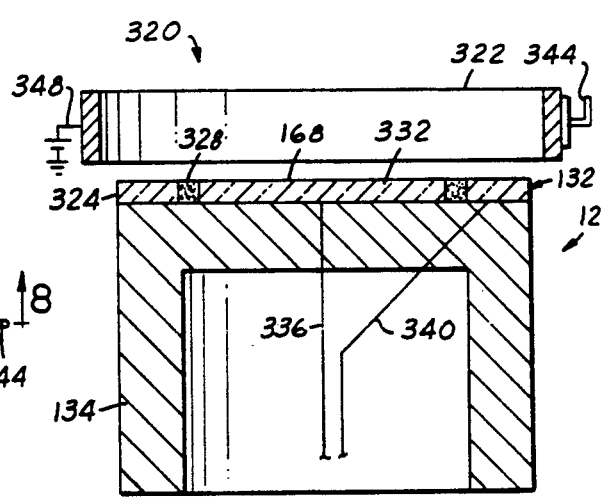
FIG. 8 is the composite susceptor assembly of FIG. 7 in cross-section along lines 8—8.

In still another embodiment of the present invention, and referring now to FIGS. 7, 8 and 9 of the drawings, a ring of conductive material, such as refractory metal described in connection with the description of layer 132, is provided above principal surface 168 of susceptor body 124. Thus, susceptor assembly 320 includes susceptor ring 322 which has an inner diameter substantially equal to the outer diameter of layer 132. Although again dimensions are not critical, in one preferred embodiment, the thickness of the ring wall is from about 0.001" to about 0.1", and the height of the ring is from about 0.001" to about 3". Ring 322 is suspended by support 344 which is electrically isolated from ring 322. For example, it may be suitable to form support 344 of a ceramic material. Support 344 may be connected by any suitable attachment means to inner wall 36 of housing 28 of chemical vapor deposition apparatus 24. Ring 322 is centered above susceptor body 124, and the bottom of ring 322 is preferably from about $-\frac{1}{2}"$ to about 1" from principal surface 168. The inner diameter of ring 322 will generally be greater than the outer diameter of layer 132 as best shown in FIG. 7.

Ring 168 is used alone or in combination with composite susceptor body 124 to electrically control the shape of plasma cloud 170. Ring 322 is electrically biased by a voltage bias source via lead 348. In operation, ring 322 is generally in the same plane as the major axis X of plasma cloud 170 (that is, plasma cloud 170 shown in FIG. 3). By applying a negative bias to ring 322, the perimeter of plasma cloud 170 can be pulled outwardly 360° to spread and flatten the plasma. This technique can be combined with the plasma control provided by conductive layer 132 of body 124. More specifically, and referring now to FIG. 8 of the drawings, ring 322 is provided above a segmented conductive layer 132 having a central disc of conductive material 322, an intermediate ring of dielectric 328 and an outer ring of conductive material 324. As stated in the explanation of the device shown in FIG. 5, disc 322 may be biased to repel the middle of the plasma cloud while a second bias is applied to outer ring 324 to draw down the perimeter of the cloud. Simultaneously, the plasma is spread by applying a voltage from about 0 to about −500 volts on ring 322. (Note that separate leads 336 and 340 are provided, rather than the use of a thermocouple sheath to bias central disc 332; this is simply another alternative construction of the present invention.)

Referring now to FIG. 10 of the drawings, in still another embodiment of the present invention, layer 132 is electrically isolated from layer or region 134 by an intervening layer of dielectric 133. This construction, that is, an intervening layer of dielectric material, may also be suitable or even preferable with the other susceptor body configurations described herein. The nature of suitable dielectrics for use in forming layer 133 will be appreciated by those skilled in the art, and a ceramic material is particularly preferred. By electrically isolating layer 132 from layer 134 in this manner, the effect of region 134 on the potential of layer 132 is eliminated.

Similarly, and referring now to FIG. 11 of the drawings, in still another embodiment of the present invention, a layer of dielectric 137 is shown disposed on layer 132. Dielectric layer 137 is formed of a material which shifts the phase of microwaves impinging on principal surface 168. While the specific interaction of the equipotential plane presented by biasing layer 132 and the microwave energy incident on principal surface 168 is not fully understood in the context of the deposition process, it will be appreciated that such an interaction does take place. By utilizing a layer of phase-shifting material 137 in this manner, this interaction can be controlled to some extent. For example a layer of silicon from about 0.005" to about $\frac{1}{4}"$ in thickness, shown as layer 137, produces a significant change in the shape of plasma 170 where layer 132 is biased from about 0 volt to about −500 volts. Other materials which may be suitable in forming layer 137 are $SiO_2$, $Al_2O_5$, $Ta_2O_3$, and $TiO_2$. Layer 137 may be smaller than or completely cover layer 132 as shown in FIG. 11 of the drawings and will typically have a thickness of from about 1/16" to about $\frac{3}{8}"$, and more preferably from about $\frac{1}{4}"$.

The following example is provided to more fully describe the practice of the method of the present invention and to illustrate the usefullness of the present invention in providing films of uniform thickness. This example is not intended to in any manner limit the scope of the invention as set forth in the appended claims.

EXAMPLE

In the CVD apparatus as substantially shown in FIG. 1 of the drawings, a film of diamond was formed as a deposit on a standard 4" silicon wafer. A gas feedstock comprising 990 SCCM Hydrogen and 10 SCCM Methane was intoduced into the CVD chamber at a pressure of 20 Torr. A gas plasma was formed by microwave radiation at a frequency of 2.45 $GH_z$. A composite susceptor in accordance with the present invention having a top conductive layer of molybdenum disposed on a polycrystalline graphite block was utilized. As measured by the thermocouple, the conductive layer was raised to a temperature of about 900° C. The molybdenum conductive layer was grounded (0 volts). A layer of diamond was deposited in this manner having a maximum thickness of between 5–6 um. The uniformity of the deposit is illustrated in FIG. 12 of the drawings as measured using a TENCOR TM P-1 profilometer.

Thus, it is apparent that there has been provided in accordance with the invention a method and apparatus that fully satisfies the objects, aims and advantages set forth above. While the invention has been described in connection with specific embodiments thereof, it is evident that many alternatives, modifications and variations will be apparent to those skilled in the art in light of the foregoing description. Accordingly, it is intended to embrace all such alternatives, modifications and variations that fall within the spirit and broad scope of the appended claims.

What is claimed is:
1. A composite susceptor, comprising:
    a susceptor body for use in a deposition apparatus of the type in which a material is deposited on a substrate adjacent said susceptor body;

said susceptor body having a first region of a first preselected material, said first region having a first predetermined electrical resistance;

said susceptor body further having a second region of a second preselected material, said second region having a second predetermined electrical resistance;

said first predetermined electrical resistance being less than said second predetermined electrical resistance, and wherein said second region defines a cavity for receiving means for heating said susceptor.

2. The susceptor recited in claim 1 further including means for controlling the electrical potential of said first region.

3. The susceptor recited in claim 1, wherein said first region is a refractory metal.

4. The susceptor recited in claim 1, wherein said first preselected material is a refractory metal selected from the group consisting of molybdenum, tungsten, tantalum and niobium and combinations thereof.

5. The invention recited in claim 1, wherein said heating means is an induction coil.

6. A composite susceptor, comprising:

a susceptor body for use in a deposition apparatus of the type in which a material is deposited on a substrate, said substrate being adjacent said susceptor body;

said susceptor body having a first region having a first predetermined electrical resistance;

said susceptor body having a second region having a second predetermined electrical resistance;

said second region defining a cavity to receive an induction heating coil, wherein the value of said first predetermined electrical resistance is less than the value of said second predetermined electrical resistance, and wherein the material from which said first region of material is formed has a specific resistance of from about 2 microohm-cm to about 200 microohm-cm.

7. A composite susceptor for use in a deposition apparatus of the type in which a material is deposited on a substrate, said substrate contacting said susceptor, said composite susceptor comprising:

a composite susceptor having a principal surface on which a substrate is received;

said composite susceptor body including a region of a first material at said principal surface, said first region having a first electrical resistance;

said composite susceptor body further including a region of a second material adjacent said region of said first material, said second region having a second electrical resistance; and wherein the electrical resistance of said second region is greater than the electrical resistance of said first region.

8. The invention recited in claim 7, further including a layer of dielectric disposed between said first and second regions.

9. The invention recited in claim 7, further including a ring of material spaced from said principal surface, said ring having an electrical resistance less than that of said second region.

10. The invention recited in claim 9, further including a layer of dielectric disposed between said first and second region.

11. The invention recited in claim 7, further including a layer of phase-shifting material disposed on said first region at said principal surface.

12. The invention recited in claim 11, further including a ring of material spaced from said principal surface, said ring having an electrical resistance less than that of said second regions.

13. The invention recited in claim 11, further including a layer of dielectric disposed between said first and second regions.

14. A composite susceptor, comprising:

a composite susceptor body having a first region of material said first region of material having a principal surface;

said composite susceptor body having a second region of material underlying said first region of material;

said second region of material having a higher electrical conductance than said first region of material;

said first region of material including sub-regions of said first material; and said sub-regions being substantially electrically isolated from one another.

15. The invention recited in claim 14, further including a layer of dielectric disposed between said first and second regions of material.

16. The invention recited in claim 14, further including a layer of phase-shifting material disposed on said first region of material at said principal surface.

17. The invention recited in claim 16, further including a ring of material spaced from said principal surface, said ring having an electrical resistance less than that of said second region of material.

18. The invention recited in claim 16, further including a layer of dielectric disposed between said first and second regions of material.

19. The composite susceptor recited in claim 16, wherein the material from which said first region of material is formed has a specific resistance of from about 2 microohm-cm to about 200 microohm-cm.

20. The composite susceptor recited in claim 16, wherein the material from which said second region of material is formed has a specific resistance of from about 50 microohm-cm to about 50,000 microohm-cm.

21. The invention recited in claim 14, further including a ring of material spaced from said principal surface, said ring having an electrical resistance less than that of said second region of material.

22. The invention recited in claim 21, further including a layer of dielectric disposed between said first and second regions of material.

23. A method of forming a deposit of material on a substrate by chemical vapor deposition in the chamber of a chemical vapor deposition apparatus comprising the following steps:

providing means for heating a substrate on which a material is to be deposited from a gaseous feedstock having a charged species;

said heating means including a body of material having two distinct regions;

one of said regions having a lower electrical resistance than said other of said regions;

placing a substrate adjacent said body in a chemical vapor deposition apparatus having a chamber such that said body and said substrate reside in said chamber and such that said one of said regions of said body is closer to said substrate than said other of said regions;

heating said substrate to a predetermined temperature with said heating means;

introducing a gaseous feedstock into said chamber under conditions wherein said gaseous feedstock includes electrically charged species in said chamber;

a portion of said gaseous feedstock flowing to an area adjacent said substrate;

electrically biasing said one region of said body with electrical biasing means in a manner which interacts with said charged species of said gaseous feedstock; and contacting said substrate with said gaseous feedstock under conditions which promote the formation of a deposit of a material on said substrate originating from said gaseous feedstock.

24. A composite susceptor, comprising:

a susceptor body for use in a deposition apparatus of the type in which a material is deposited on a substrate adjacent said susceptor body;

said susceptor body having a first region of a first preselected material, said first region having a first predetermined electrical resistance;

said susceptor body further having a second region of a second preselected material, said second region having a second predetermined electrical resistance;

said first predetermined electrical resistance being less than said second predetermined electrical resistance, and wherein said second preselected material can be inductively heated to a temperature of from 100° C. to 1500° C. and is thermally stable at said temperatures.

25. A composite susceptor, comprising:

a susceptor body for use in a deposition apparatus of the type in which a material is deposited on a substrate adjacent said susceptor body;

said susceptor body having a first region of a first preselected material, said first region having a first predetermined electrical resistance;

said susceptor body further having a second region of a second preselected material, said second region having a second predetermined electrical resistance;

said first predetermined electrical resistance being less than said second predetermined electrical resistance, and wherein said second preselected material is selected from the group consisting of polycrystalline graphite and doped cubic boron nitride.

26. A composite susceptor, comprising:

a susceptor body for use in a deposition apparatus of the type in which a material is deposited on a substrate adjacent said susceptor body;

said susceptor body having a first region of a first preselected material, said first region having a first predetermined electrical resistance;

said susceptor body further having a second region of a second preselected material, said second region having a second predetermined electrical resistance;

said first predetermined electrical resistance being less than said second predetermined electrical resistance, and wherein said first preselected material has a specific resistance of from about 2 microohm-cm to about 200 microohm-cm.

27. A composite susceptor, comprising:

a susceptor body for use in a deposition apparatus of the type in which a material is deposited on a substrate adjacent said susceptor body;

said susceptor body having a first region of a first preselected material, said first region having a first predetermined electrical resistance;

said susceptor body further having a second region of a second preselected material, said second region having a second predetermined electrical resistance;

said first predetermined electrical resistance being less than said second predetermined electrical resistance, and wherein said second preselected material has a specific resistance of from about 50 microohm-cm to about 50,000 microohm-cm.

28. A composite susceptor, comprising:

a susceptor body for use in a deposition apparatus of the type in which a material is deposited on a substrate, said substrate being adjacent said susceptor body;

said susceptor body having a first region having a first predetermined electrical resistance;

said susceptor body having a second region having a second predetermined electrical resistance;

said second region defining a cavity to receive an induction heating coil, wherein the value of said first predetermined electrical resistance is less than the value of said second predetermined electrical resistance, and wherein the material from which said second region of material is formed has a specific resistance of from about 50 microohm-cm to about 50,000 microohm-cm.

* * * * *